(12) United States Patent
Sudo

(10) Patent No.: US 8,004,035 B2
(45) Date of Patent: Aug. 23, 2011

(54) DUAL STRESS LINER DEVICE AND METHOD

(75) Inventor: Gaku Sudo, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 56 days.

(21) Appl. No.: 12/534,983

(22) Filed: Aug. 4, 2009

(65) Prior Publication Data

US 2009/0289375 A1 Nov. 26, 2009

Related U.S. Application Data

(62) Division of application No. 11/428,692, filed on Jul. 5, 2006, now Pat. No. 7,585,720.

(51) Int. Cl.
*H01L 21/00* (2006.01)

(52) U.S. Cl. . 257/327; 257/374; 257/466; 257/E21.409; 257/E21.424; 257/E21.551; 257/E27.006; 257/E29.193; 257/E29.226; 257/E29.255

(58) Field of Classification Search .......... 257/327–374, 257/466, 510, 639–649, E21.409, 424, 495, 257/538, 551–554, E27.006, E29.193, 226, 257/255

See application file for complete search history.

(56) References Cited

U.S. PATENT DOCUMENTS

| | | | |
|---|---|---|---|
| 5,841,170 A | 11/1998 | Adan et al. | |
| 6,046,494 A | 4/2000 | Brigham et al. | |
| 6,573,172 B1 | 6/2003 | En et al. | |
| 6,825,529 B2 | 11/2004 | Chidambarrao et al. | |
| 6,939,814 B2 | 9/2005 | Chan et al. | |
| 7,022,561 B2 | 4/2006 | Huang et al. | |
| 7,060,549 B1 | 6/2006 | Craig et al. | |
| 7,101,744 B1 | 9/2006 | Dyer et al. | |
| 7,105,394 B2 | 9/2006 | Hachimine | |
| 7,115,954 B2 | 10/2006 | Shimizu et al. | |
| 7,187,038 B2 | 3/2007 | Morin et al. | |
| 7,193,254 B2 | 3/2007 | Chan et al. | |
| 7,205,615 B2 | 4/2007 | Tsutsui et al. | |
| 7,214,629 B1 | 5/2007 | Luo et al. | |
| 7,220,630 B2 * | 5/2007 | Cheng et al. | 438/199 |
| 7,244,644 B2 * | 7/2007 | Zhu et al. | 438/199 |
| 7,279,746 B2 | 10/2007 | Doris et al. | |

(Continued)

FOREIGN PATENT DOCUMENTS

JP 2006173432 A 6/2006

(Continued)

OTHER PUBLICATIONS 2007-177644, JP Notification of Reasons for Rejection, Examiner's Notice date Jan. 25, 2010, mail date Feb. 2, 2010.

(Continued)

*Primary Examiner* — Michael S Lebentritt
(74) *Attorney, Agent, or Firm* — Banner & Witcoff, Ltd

(57) ABSTRACT

A dual stress liner manufacturing method and device is described. Overlapping stress liner layers of opposite effect (e.g., tensile versus compression) may be deposited over portions of the device, and the uppermost overlapping layer may be polished down in a process that uses the bottom overlapping layer as a stopper. An insulating film may be deposited on the stress liner layers before the polishing, and another insulating film may be deposited above the first insulating film after the polishing. Contacts may be formed such that the contacts need only penetrate one stress liner layer to reach a transistor well or gate structure.

7 Claims, 3 Drawing Sheets

U.S. PATENT DOCUMENTS

| | | | |
|---|---|---|---|
| 7,288,451 B2 | 10/2007 | Zhu et al. | |
| 7,309,637 B2 * | 12/2007 | Lee et al. | 438/303 |
| 7,314,836 B2 * | 1/2008 | Golonzka et al. | 438/761 |
| 7,361,539 B2 * | 4/2008 | Chen et al. | 438/197 |
| 7,396,718 B2 | 7/2008 | Frohberg et al. | |
| 7,396,724 B2 * | 7/2008 | Chan et al. | 438/275 |
| 7,402,885 B2 | 7/2008 | Sudo | |
| 7,417,289 B2 | 8/2008 | Tsutsui et al. | |
| 7,436,030 B2 * | 10/2008 | Yang et al. | 257/374 |
| 7,462,527 B2 | 12/2008 | Conti et al. | |
| 7,470,615 B2 * | 12/2008 | Costrini et al. | 438/637 |
| 7,470,943 B2 * | 12/2008 | Yang | 257/288 |
| 7,482,215 B2 * | 1/2009 | Dyer et al. | 438/199 |
| 7,485,521 B2 * | 2/2009 | Zhu et al. | 438/199 |
| 7,508,053 B2 * | 3/2009 | Ting et al. | 257/647 |
| 7,518,193 B2 * | 4/2009 | Anderson et al. | 257/369 |
| 7,521,307 B2 | 4/2009 | Zhu et al. | |
| 7,528,028 B2 | 5/2009 | Liang et al. | |
| 7,531,401 B2 * | 5/2009 | Baiocco et al. | 438/199 |
| 7,586,158 B2 * | 9/2009 | Hierlemann et al. | 257/369 |
| 7,592,653 B2 * | 9/2009 | Sudo | 257/285 |
| 7,659,174 B2 * | 2/2010 | Lee et al. | 438/303 |
| 7,727,834 B2 * | 6/2010 | Sudo | 438/228 |
| 2003/0040158 A1 | 2/2003 | Saitoh | |
| 2003/0181005 A1 | 9/2003 | Hachimine et al. | |
| 2007/0018328 A1 * | 1/2007 | Hierlemann et al. | 257/762 |
| 2007/0099360 A1 | 5/2007 | Lee et al. | |
| 2007/0108529 A1 | 5/2007 | Huang et al. | |
| 2007/0194382 A1 | 8/2007 | Miyashita et al. | |
| 2009/0001466 A1 * | 1/2009 | Yang et al. | 257/347 |
| 2009/0014807 A1 * | 1/2009 | Tang et al. | 257/369 |
| 2009/0065872 A1 * | 3/2009 | Zhu | 257/369 |
| 2009/0206414 A1 * | 8/2009 | Sudo | 257/369 |
| 2010/0035400 A1 * | 2/2010 | Zhu et al. | 438/300 |
| 2010/0171180 A1 * | 7/2010 | Zhang et al. | 257/369 |

FOREIGN PATENT DOCUMENTS

| | | |
|---|---|---|
| JP | 2007-208166 | 8/2007 |
| JP | 2007235074 A | 9/2007 |

OTHER PUBLICATIONS

H.S. Yang, et al., "Dual Stress Liner for High Performance sub-45nm Gate Length SOI CMOS Manufacturing," IEEE 2004; IEDM 04, pp. 1075-1077.

2007-177644, JP Notification of Reasons for Rejection, Examiner's Notice date May 23, 2011, mail date May 31, 2011.

* cited by examiner

DUAL STRESS LINER DEVICE AND METHOD

RELATED APPLICATION

This application is a divisional of U.S. application Ser. No. 11/428,692, entitled "DUAL STRESS LINER DEVICE AND METHOD," filed on Jul. 5, 2006, which is herein incorporated by reference in its entirety for all purposes.

BACKGROUND

The use of strained silicon in the manufacturing of semiconductor devices has gained popularity as an effective way to improve conductance in the transistors of such devices. Early efforts at using strained silicon involved embedding silicon-germanium in a silicon layer on opposing sides of a transistor channel region, which caused the silicon atoms in the channel layer to "stretch" in a natural attempt to align with the structure of the silicon-germanium.

The Si—Ge approach is helpful for increasing conductance, which benefits n-type field-effect transistors (FETs, or NFETs), but p-type FETs, or PFETs, did not benefit from the stretched channels. Instead, p-type FETs benefit from the opposite—a more compressed silicon lattice structure in their channel regions. Accordingly, dual stress liner devices have been developed that allow n-type and p-type devices to both enjoy the benefits of strained silicon.

FIG. 1 illustrates an example of a current approach to such dual stress liner devices. On the semiconductor substrate 100, transistor structures such as silicide 101 may be formed, and an isolation structure (e.g., shallow trench isolation 102) may be formed to electrically separate transistors from each other. For example, NFET devices may be formed in a p-well on the left, and PFET may be formed in an n-well on the right. Transistor gate structures 103, such as gate electrodes, gate layers, insulation layers, sidewall spacers, etc. and additional silicide 104 and 105 may be formed as well. Silicide 105 and gate structure may be used as interconnects in regions over the isolation structure 102.

To provide the dual stresses, a tensile stress film 106 may be formed over one region (e.g., an NFET region), while a compressive stress film 107 may be formed over the other region (e.g., a PFET region). Lining up these films at the boundary results in either an overlap (as shown) or a gap (not shown) between the two films. Because leaving a gap would expose the interconnect gate 105 to additional etching when forming contact structures 108a,b, an overlap of the two films is generally preferred.

When forming contact structures 108a,b, careful control over the etching process (e.g., reactive ion etching) is needed to ensure that the structures 108a,b penetrate to the appropriate depth. Since some structures 108a need to penetrate two stress films, while other structures 108b need only penetrate through one stress film, the formation of structures 108a,b is a difficult process.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A dual stress liner semiconductor device may be manufactured by forming transistors in and on a semiconductor substrate, and then forming two stress liners on different regions of the device. The stress liners may be of opposite effect (e.g., one tensile, the other compression), and the liners may overlap.

A polishing process, such as chemical and/or mechanical polishing, may be used to remove an overlapping portion of one of the stress liners. The polishing process may use the other stress liner as a stopper. Contacts may then be formed, where each contact need only penetrate one stress liner (even a contact formed where the overlap occurred). A contact may lie at the boundary between the two stress liners.

In some aspects, the overlap in stress liners may occur over a gate structure, which may be an interconnect gate structure having an isolation region underneath or a transistor gate structure having a channel region underneath.

In some aspects, an insulating film, such as an inter-layer dielectric, may be deposited over the stress liners before the polishing, thereby resulting in a height equal to (or substantially equal to, depending on effectiveness and level-ness of polishing) that of the first stress liner. Another insulating film (of the same material, or different) may be deposited after the polishing.

DETAILED DESCRIPTION

Figure 1:
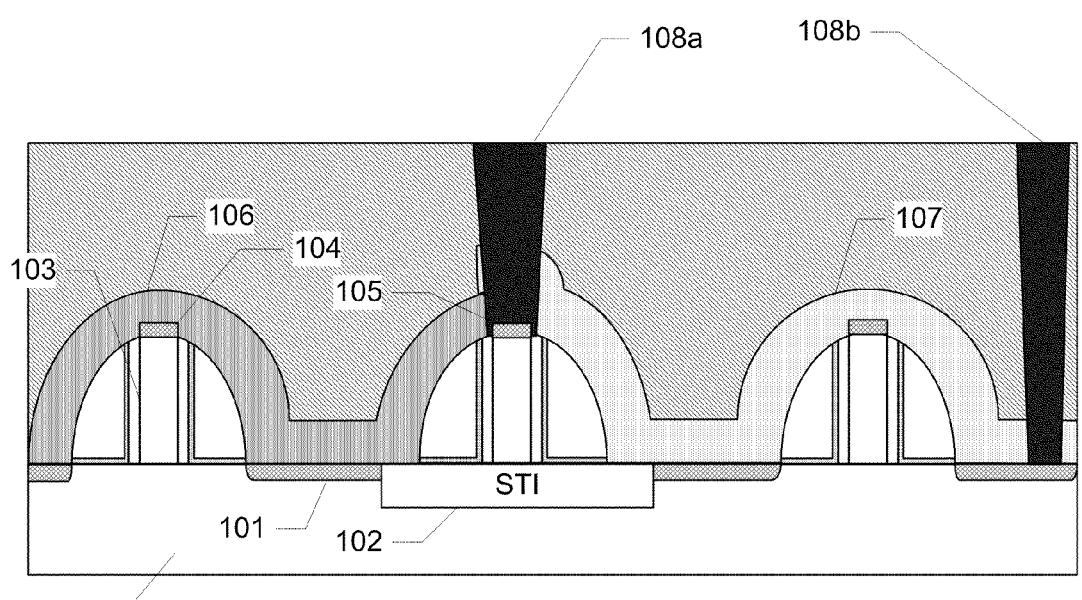
FIG. 1 illustrates an example of a dual stress liner structure semiconductor device.
Figure 2A:
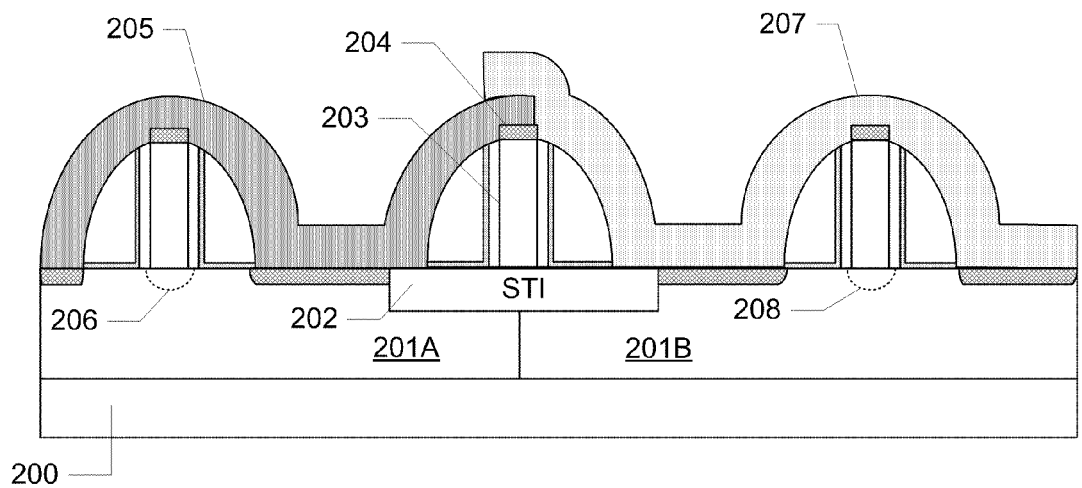
FIGS. 2A-E illustrate steps used to create a dual stress liner structure employing features described herein.

As illustrated in FIG. 2A, a silicon layer 200 (which may be, for example, a bulk silicon substrate or part of a silicon-on-oxide configuration) may have p- and n-type wells 201A, 201B, respectively, formed through any desired implantation process, such as ion implantation. Isolation structure 202 may be formed as a shallow trench isolation (STI) structure by, for example, depositing silicon dioxide ($SiO_2$) in trenches formed in the silicon layer 200, to electrically isolate circuit elements, such as FETs, from each other. Transistor and/or interconnect structures, such as gate interconnect 203 and silicide 204, may be formed throughout the regions in any desired manner as well. Gate interconnect 203, and the gates of the NFET and the PFET, may be formed of a conductive material such as polycrystalline silicon, also known as polysilicon.

A tensile stress liner 205 may be deposited over some or all of the p-well. The tensile stress liner 205 may be a silicon nitride (SiN) film, and may be deposited in a conventional manner or any other manner. The tensile stress liner 205 may further overlay NFET structures and interconnect structures, as shown in FIG. 2A. The tensile stress liner 205 has a crystalline lattice structure that, when on the silicon layer 200, tends to cause the lattice structure of that portion of the silicon layer 200 at the interface to shrink in an attempt to align with the relatively smaller lattice structure of the tensile stress liner 205. This shrinking causes a tension in the channel region between the wells of a device, such as channel region 206.

After the tensile stress liner 205 is formed, a compressive stress liner 207 may be formed over some or all of the n-well 201B. The compressive stress liner 207 may be a doped silicon nitride (SiN) film, as is known in the art. The compressive stress liner 207 has a relatively large lattice structure that, when formed on silicon layer 200, causes that portion of the relatively smaller lattice structure of the silicon layer 200 at the liner/silicon interface to expand. This expansion causes a corresponding compression in the channel forming region 208 of the PFET.

By the addition of these stress liners 205,207, the region of the device under the tensile stress liner 205 may be used to form n-type devices, such as an NFET, while the region of the device under the compressive stress liner 207 may be used to form p-type devices, such as a PFET. The compressive stress liner 207 is deposited so that it overlaps a portion of the tensile stress liner 205 at a boundary between the two regions of the device. The overlapping area may be disposed over a gate interconnect structure that can be used for interconnecting devices on the substrate 200.

Figure 2B:
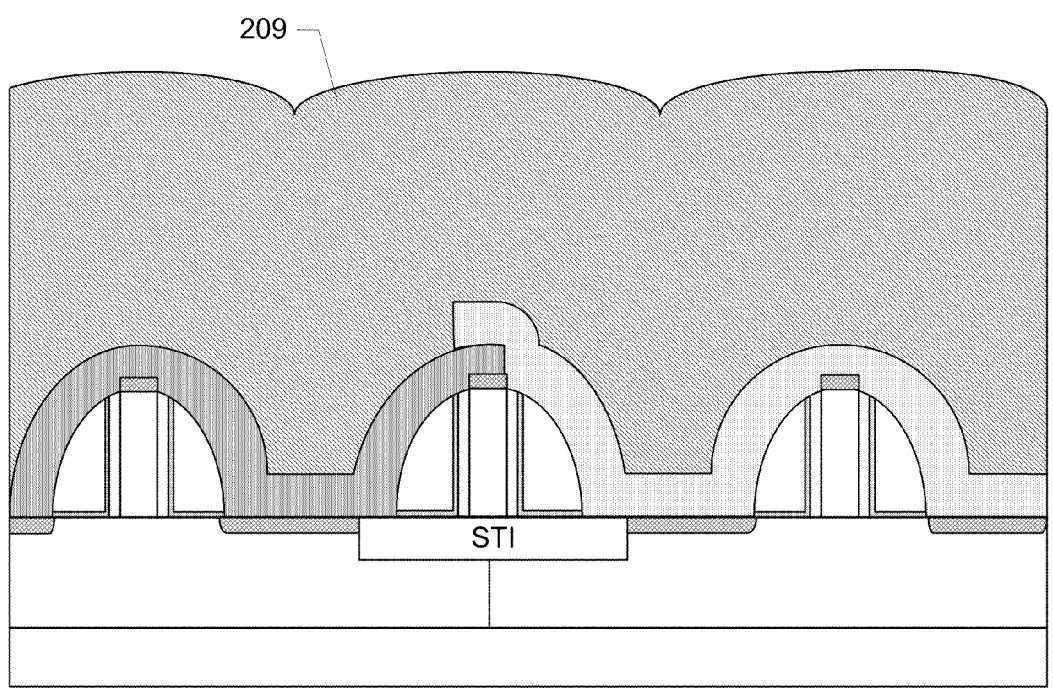
Figure 2C:
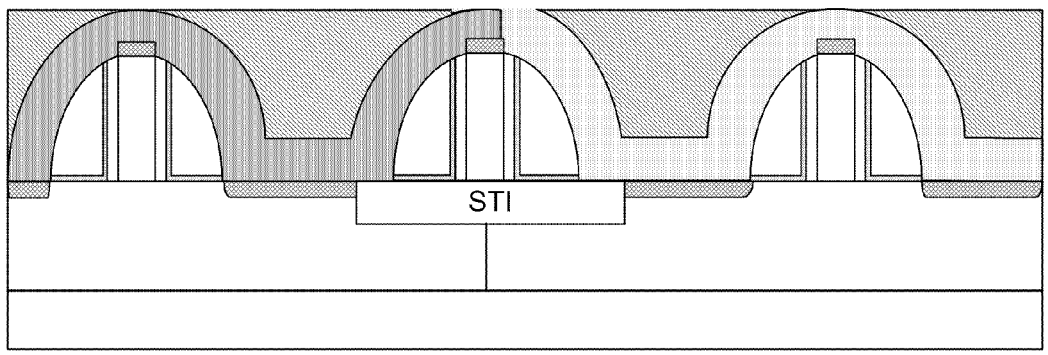

When the two stress liners are formed, an insulating film 209, such as undoped silicon dioxide may be deposited to cover the surface of the device, as shown in FIG. 2B. The insulating film may be formed by any desired process (e.g., chemical vapor deposition, sputtering, etc.), and after the insulating film 209 is formed, it may be polished back through any desired polishing technique, such as chemical mechanical polishing (CMP). In this CMP technique, and as shown in FIG. 2C, the first stress film (e.g., tensile film 205) and a portion of the second stress film 207 may be used as a stopper, such that the CMP stops when it reaches that first stress liner. The polishing process may be stopped by detecting surface level differences in the film 207 between portions overlapping film 205 and other portions, such as the portion over STI 202.

The polishing process may continue until the overlapping portion of the second stress film (e.g., film 207) is removed over the gate structure area. Other portions of this film 207, such as the portions over the STI 202 or transistor source/drain regions may remain in place.

Figure 2D:
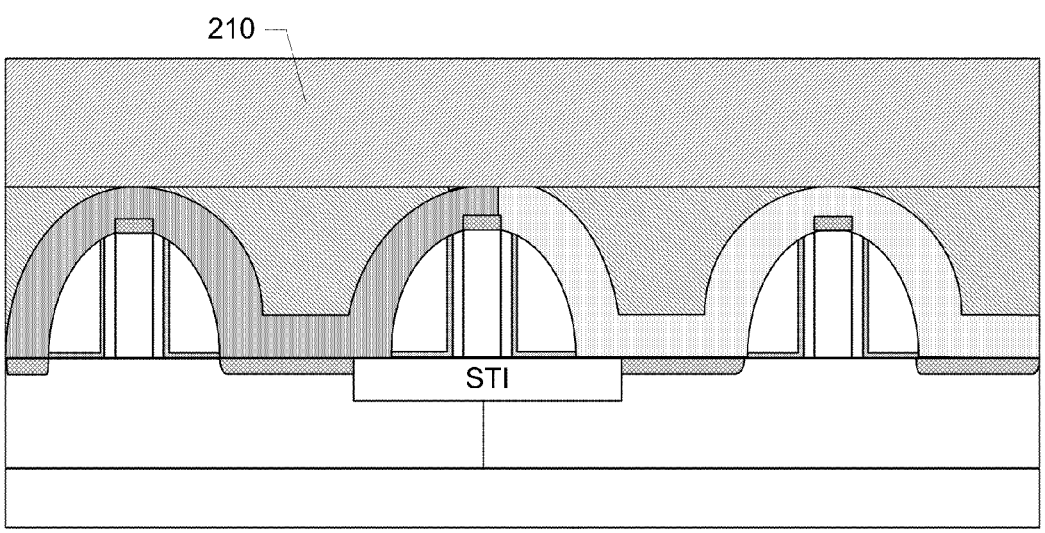

When the polishing is completed and the device is subsequently cleaned, a second insulating film 210 may be deposited over the first 209, such as shown in FIG. 2D. The second insulating film 210 may be of the same material as the first, or it may be a different material as desired. The second insulating film 210 may also be polished, if desired.

Figure 2E:
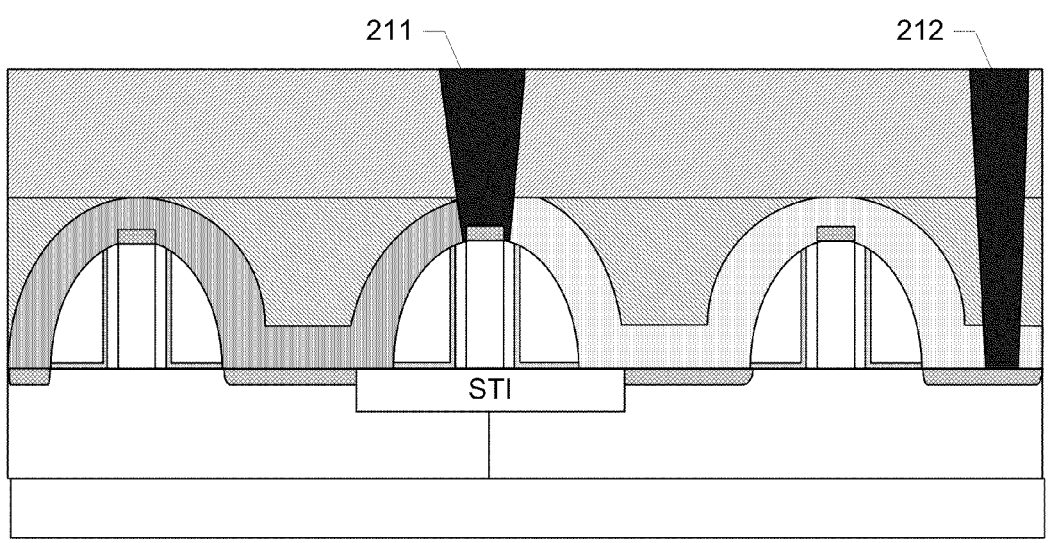

After the second insulating film is deposited, conductive contacts, such as contacts 211, 212, may then be formed to electrically connect with various gate structures, as shown in FIG. 2E. These contacts 211, 212 may be formed using an etching process (e.g., reactive ion etching) and subsequent metal deposition process. Although only two contacts are illustrated, any number of contacts may be formed as needed to reach the gate structures in the device. This etching process may be more easily accomplished in view of the fact that the overlapping stress liner was removed.

The description above illustrates examples of features described herein, but are merely examples, and other alternatives are also possible. For example, FIG. 2A illustrates a tensile film 205 being deposited first, followed by the compression film 207. As an alternative, these films may be deposited in reverse order, or on opposite ends of the device shown, and the regions of the device may be designated to be for different types of devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim the following:

1. A semiconductor device, comprising:
   a substrate;
   first and second field-effect transistors formed on and in said substrate;
   a tensile stress liner formed over the first field-effect transistor;
   a compression stress liner formed over the second field-effect transistor; and
   a conductive contact disposed between the first and second field-effect transistors, wherein a first side of said contact is adjacent to said tensile stress liner, an opposite second side of said contact is adjacent to said compression stress liner, and wherein said stress liners do not overlap.

2. The device of claim 1, wherein said stress liners are SiN stress liners.

3. The device of claim 1, further comprising a first insulating layer having a top surface at a height common with a top surface of one of said stress liners.

4. The device of claim 3, further comprising a second insulating layer formed on said first insulating layer.

5. The device of claim 4, wherein said contact is formed in a trench formed in said second insulating layer but not in said first insulating layer.

6. The device of claim 5, further comprising a second contact extending through both of said insulating layers and only one of said stress layers to reach one of said field-effect transistors.

7. The device of claim 1, wherein said contact is an interconnect contact that reaches an interconnect gate structure, and where said interconnect gate structure is above an isolation region of said substrate.

* * * * *